United States Patent [19]

Niwa

[11] Patent Number: 5,597,752
[45] Date of Patent: Jan. 28, 1997

[54] METHOD FOR MANUFACTURING LDD TYPE SEMICONDUCTOR DEVICE WITH COMPLETE SELF-ALIGNMENT

[75] Inventor: Kenji Niwa, Tokyo, Japan

[73] Assignee: NEC Corporation, Tokyo, Japan

[21] Appl. No.: 519,642

[22] Filed: Aug. 25, 1995

[30] Foreign Application Priority Data

Aug. 27, 1994 [JP] Japan .................. 6-225891

[51] Int. Cl.$^6$ .............................................. H01L 21/8234
[52] U.S. Cl. .................. 437/44; 437/27; 437/40; 437/41
[58] Field of Search ............................. 437/44, 913, 27, 437/29, 30, 233, 41 RLD, 40 SW

[56] References Cited

U.S. PATENT DOCUMENTS

| 5,141,891 | 8/1992 | Arima et al. | 437/44 |
| 5,175,119 | 12/1992 | Matsutani | 437/44 |
| 5,429,956 | 7/1995 | Shell et al. | 437/44 |
| 5,434,093 | 7/1995 | Chau et al. | 437/44 |
| 5,445,983 | 8/1995 | Hong | 437/44 |

FOREIGN PATENT DOCUMENTS

| 63-67778 | 3/1988 | Japan . |
| 1189964 | 7/1989 | Japan . |
| 4346476 | 12/1992 | Japan . |

Primary Examiner—Charles L. Bowers, Jr.
Assistant Examiner—Michael Trinh
Attorney, Agent, or Firm—Whitham, Curtis, Whitham & McGinn

[57] ABSTRACT

In a method for manufacturing an LDD type semiconductor device, an insulating layer is formed on a semiconductor substrate of a first conductivity type, and an opening is formed in the insulating layer. Then, a first sidewall insulating layer is formed on a sidewall of the insulating layer, and a gate insulating layer is formed on the semiconductor substrate. Then, a gate electrode is buried in the opening. Then, the first sidewall insulating layer is removed, and impurities of a second conductivity type are introduced into the semiconductor substrate to form a low concentration impurity region in the semiconductor substrate. Then, the insulating layer is removed, and a second sidewall insulating layer is formed on a sidewall of the gate electrode. Finally, impurities of the second conductivity type are introduced into the semiconductor substrate to form a high concentration impurity region in the semiconductor substrate.

13 Claims, 9 Drawing Sheets

METHOD FOR MANUFACTURING LDD TYPE SEMICONDUCTOR DEVICE WITH COMPLETE SELF-ALIGNMENT

BACKGROUND OF THE INVENTION

1. Field of the Invention

The present invention relates to a method for manufacturing a lightly-doped drain (LDD) type metal oxide semiconductor (MOS) device.

2. Description of the Related Art

In a fine-structured MOS device, in order to avoid deterioration of characteristics due to hot carriers, an LDD type structure has been used.

In a first prior art method for manufacturing an LDD type MOS transistor (see FIGS. 2A to 2G of JP-A-1-189964 and FIG. 2 of JP-A-4-346476), a gate electrode is formed via a gate insulating layer on a P-type semiconductor substrate. Then, N-type impurity ions such as phosphorous ions are implanted into the semiconductor substrate with a mask of the gate electrode, to form a lean, i.e., low concentration N-type impurity region in the semiconductor substrate. Then, a sidewall insulating layer is formed on a sidewall of the gate electrode, and N-type impurity ions such as arsenic ions are implanted into the semiconductor substrate with a mask of the gate electrode and the sidewall insulating layer to form a rich, i.e., high concentration $N^+$-type impurity region in the semiconductor substrate. This will be explained later in detail.

Thus, in the first prior art manufacturing method, the $N^-$-type impurity region and the $N^+$-type impurity region are in self-alignment with the gate electrode. However, a channel region beneath the gate electrode into which P-type impurity ions such as boron ions are implanted to adjust the threshold voltage is not in self-alignment with the gate electrode, since such ion implantation is carried out before the formation of the gate electrode. Therefore, the transistor characteristics such as the threshold voltage and the breakdown voltage fluctuate in accordance with the fluctuation of location of the channel region. Also, the size of the gate electrode is determined by a lithography process using an exposure system, and therefore, it is impossible to reduce the size of the gate electrode smaller than a minimum size determined by the exposure system. For example, a gate length of sub μ smaller than 0.5 μm cannot be obtained.

In a second prior art method for manufacturing an LDD type MOS transistor (see JP-A-63-67778), a gate electrode is formed via a gate insulating layer on a P-type semiconductor substrate. Then, N-type impurity ions such as arsenic ions are implanted into the semiconductor substrate with a mask of the gate electrode, to form a rich, i.e., high concentration $N^+$-type impurity region in the semiconductor substrate. Then, the gate electrode is etched by an isotropical etching process, to form a reduced gate electrode. Then, a sidewall insulating layer is formed on a sidewall of the reduced gate electrode, and N-type impurity ions such as phosphorous ions are implanted into the semiconductor substrate with a mask of the reduced gate electrode and the sidewall insulating layer to form a lean, i.e., low concentration $N^-$-type impurity region in the semiconductor substrate. This will be explained later in detail.

Thus, also in the second prior art manufacturing method, the $N^-$-type impurity region and the $N^+$-type impurity region are in self-alignment with the gate electrode. Also, in this case, however, a channel region beneath the gate electrode into which P-type impurity ions such as boron ions are implanted to adjust the threshold voltage is not in self-alignment with the gate electrode, since such ion implantation is carried out before the formation of the gate electrode. Therefore, the transistor characteristics such as the threshold voltage and the breakdown voltage fluctuate in accordance with the fluctuation of location of the channel region. Since an isotropical etching process is used, the reduced gate electrode, which is smaller than a minimum size determined by an exposure system can be obtained. For example, a gate length of sub μ smaller than 0.5 μm can be obtained. However, the size of such a reduced gate electrode is variable.

In a third prior art method for manufacturing an LDD type MOS transistor (see FIG. 1 of JP-A-4-346476), a silicon oxide layer is formed on a P-type semiconductor silicon substrate, and an opening is perforated in the silicon oxide layer. Then sidewall insulating layer is formed on a sidewall of the silicon oxide layer by an anisotropical reactive ion etching (RIE) process. In this case, the semiconductor substrate is also etched by the RIE process. Then, the semiconductor substrate is thermally oxidized to form a gate silicon oxide layer therein. Then, a gate electrode is formed on the gate silicon oxide layer and the sidewall insulating layer. Then, N-type impurity ions such as arsenic ions are implanted into the semiconductor substrate with a mask of the gate electrode and the sidewall insulating layer to form a rich, i.e., high concentration $N^+$-type impurity region. Then, the sidewall, insulating layer is removed. Then, N-type impurity ions such as phosphorous ions are implanted into the semiconductor substrate with a mask of the gate electrode to form a lean, i.e., low concentration $N^-$-type impurity region. This will be explained later in detail.

Thus, also in the third prior art manufacturing method, the $N^-$-type impurity region and the $N^+$-type impurity region are in self-alignment with the gate electrode. Also, in this case, a channel region beneath the gate electrode into which P-type impurity ions such as boron ions are implanted to adjust the threshold voltage is in self-alignment with the gate electrode. Further, a reduced gate electrode, which is smaller than a minimum size determined by an exposure system can be obtained. For example, a gate length of sub μ smaller than 0.5 μm can be obtained. However, since the gate electrode is partly buried in the semiconductor substrate, the semiconductor substrate is so damaged that defects are easily created in the channel region. As a result, the performance and reliability of the MOS transistor is deteriorated.

SUMMARY OF THE INVENTION

It is an object of the present invention to provide a method for manufacturing an LDD type semiconductor device, thereby a channel region, a low concentration impurity region (LDD region) and a high concentration impurity region (source/drain region) are all in self-alignment with a gate electrode.

Another object is to suppress the generation of defects in a channel region due to the damage of a semiconductor substrate.

According to the present invention, in a method for manufacturing an LDD type semiconductor device, an insulating layer is formed on a semiconductor substrate of a first conductivity type, and an opening is formed in the insulating layer. Then, a first sidewall insulating layer is formed on a sidewall of the insulating layer, and a gate insulating layer is formed on the semiconductor substrate. Then, a gate electrode is buried in the opening. Then, the first sidewall insulating layer is removed, and impurities of a second conductivity type are introduced into the semiconductor substrate to form a low concentration impurity region in the semiconductor substrate. Then, the insulating layer is removed, and a second sidewall insulating layer is formed on a sidewall of the gate electrode. Finally, impurities of the second conductivity type are introduced into the semiconductor substrate to form a high concentration impurity region in the semiconductor substrate.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Before the description of the preferred embodiments, prior art methods for manufacturing an LDD type MOS device will be explained with reference to FIGS. 1A to 1D, FIGS. 2A to 2D, and FIGS. 3A to 3D.

FIGS. 1A to 1D are cross-sectional views for explaining a first prior art method for manufacturing an LDD type MOS device (see FIGS. 2A to 2G of JP-A-1-189964 and FIG. 2 of JP-A-4-346476).

Figure 1A:
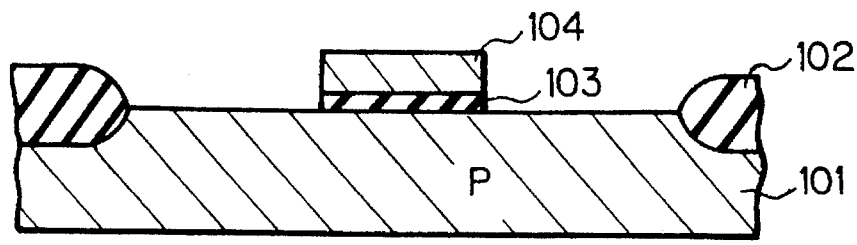
FIGS. 1A through 1D are cross-sectional views illustrating a first prior art method for manufacturing a LDD type MOS device.

First, referring to FIG. 1A, a thick silicon oxide layer 102 is formed by using a local oxidation of silicon (LOCOS) process in a P-type monocrystalline silicon substrate 101. Then, a gate thin silicon oxide layer 103 is formed by thermally oxidizing the silicon substrate 101, and a gate electrode layer 104 made of polycrystalline silicon is formed by a chemical vapor deposition (CVD) process thereon. The gate electrode layer 104 and the gate thin silicon oxide layer 103 are patterned by a photolithography process and an RIE process.

Figure 1B:
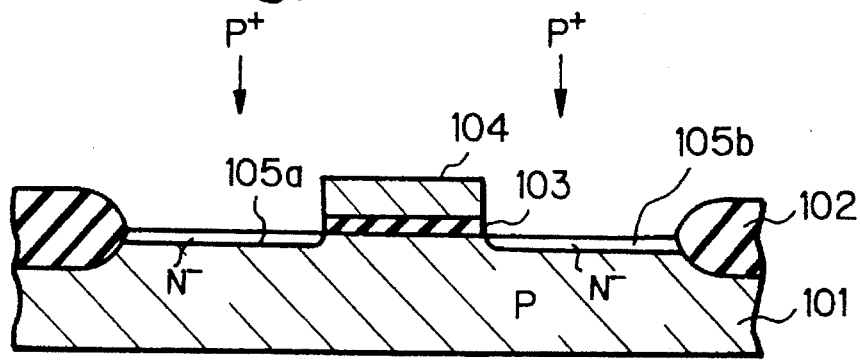

Next, referring to FIG. 1B, N-type impurity ions such as phosphorous ions are implanted into the silicon substrate 101 with a mask of the gate electrode layer 104 and the thick silicon oxide layer 102, to form lean, i.e., low concentration N⁻-type impurity regions 105a and 105b.

Figure 1C:
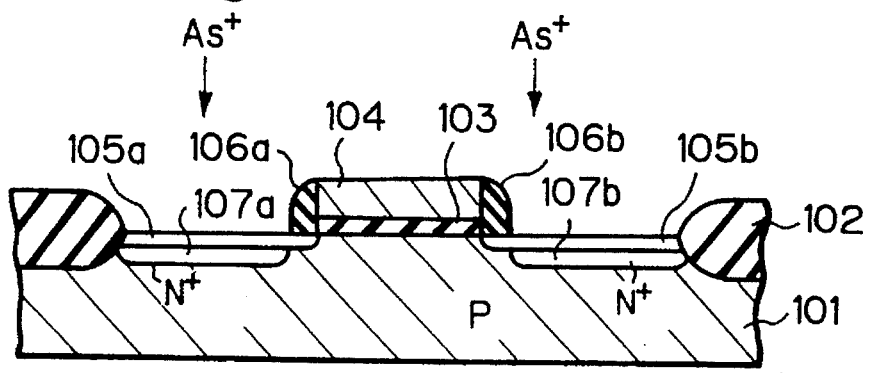

Next, referring to FIG. 1C, a silicon oxide layer is formed on the entire surface by a CVD process, and the silicon oxide layer is etched back by an anisotropical RIE process to form sidewall silicon oxide layers 106a and 106b. Next, N-type impurity ions such as arsenic ions are implanted into the silicon substrate 101 with a mask of the gate electrode layer 104, the sidewall silicon oxide layers 106a and 106b, and the thick silicon oxide layer 102, to form rich, i.e., high concentration N⁺-type impurity regions 107a and 107b.

Figure 1D:
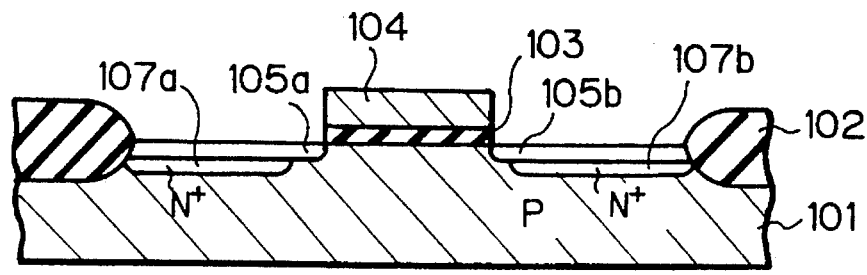

Finally, referring to FIG. 1D, the sidewall silicon oxide layers 106a and 106b are removed.

Thus, in the first prior art manufacturing method as illustrated in FIGS. 1A to 1D, the N⁻-type impurity regions 105a and 105b and the N⁺-type impurity regions 107a and 107b are in self-alignment with the gate electrode layer 104. However, a channel region beneath the gate electrode layer 104 into which P-type impurity ions such as boron ions are implanted to adjust the threshold voltage is not in self-alignment with the gate electrode layer 104, since such ion implantation is carried out before the formation of the gate electrode layer 104. Therefore, the transistor characteristics such as the threshold voltage and the breakdown voltage fluctuate in accordance with the fluctuation of location of the channel region. Also, the size of the gate electrode layer 104 is determined by a lithography process using an exposure system, and therefore, it is impossible to reduce the size of the gate electrode layer 104 smaller than a minimum size determined by the exposure system. For example, a gate length of sub μ smaller than 0.5 μm cannot be obtained.

FIGS. 2A to 2D are cross-sectional views for explaining a second prior art method for manufacturing an LDD type MOS device (see JP-A-63-67778).

Figure 2A:
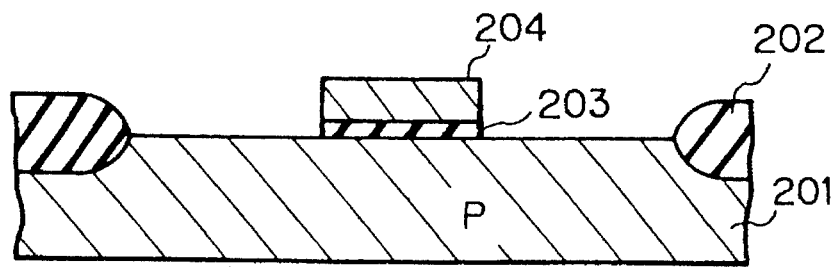
FIGS. 2A through 2D are cross-sectional views illustrating a second prior art method for manufacturing an LDD type MOS device.

First, referring to FIG. 2A, in the same way as in FIG. 1A, a thick silicon oxide layer 202 is formed by using a LOCOS process in a P-type monocrystalline silicon substrate 201. Then, a gate thin silicon oxide layer 203 is formed by thermally oxidizing the silicon substrate 201, and a gate electrode layer 204 made of polycrystalline silicon is formed by a CVD process thereon. The gate electrode layer 104 and the gate thin silicon oxide layer 103 are patterned by a photolithography process and an RIE process.

Figure 2B:
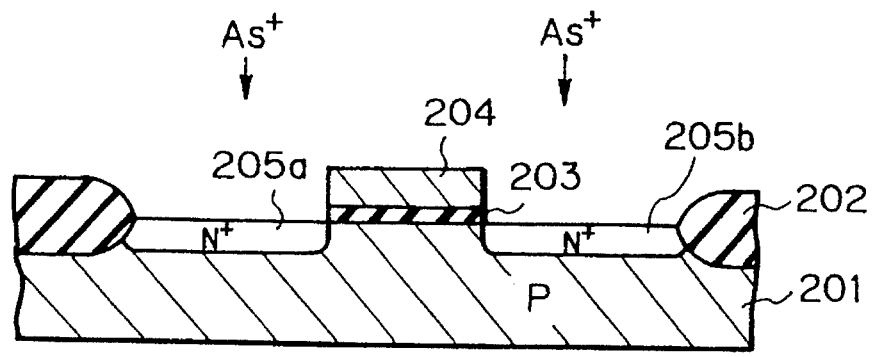

Next, referring to FIG. 2B, N-type impurity ions such as arsenic ions are implanted into the silicon substrate 101 with a mask of the gate electrode layer 204 and the thick silicon oxide layer 202, to form rich, i.e., high concentration N⁺-type impurity regions 205a and 205b.

Figure 2C:
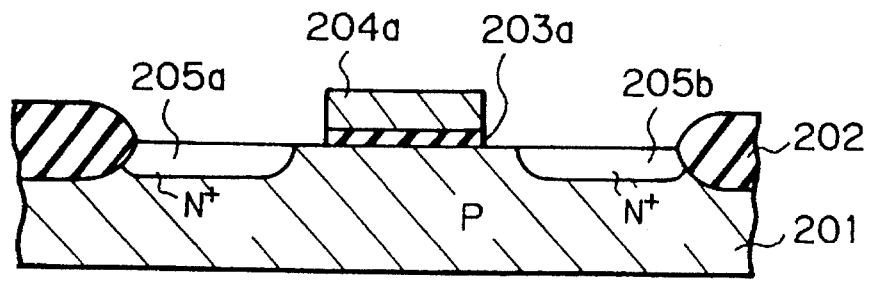

Next, referring to FIG. 2C, the gate electrode layer 204 and the gate silicon oxide layer 203 are etched by an isotropical etching process, to form a reduced gate electrode layer 204a and a reduced gate silicon oxide layer 203a.

Figure 2D:
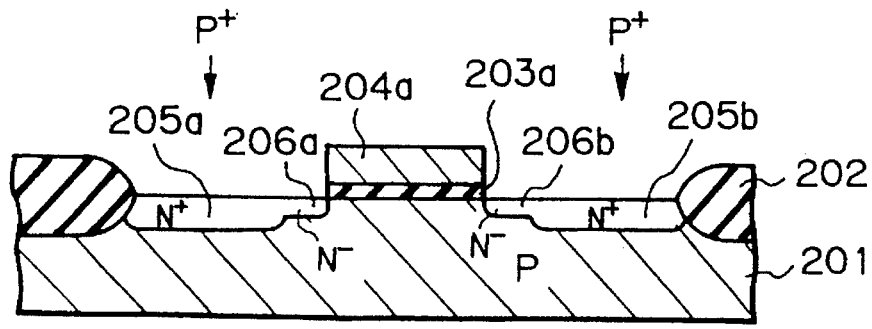

Finally, referring to FIG. 2D, N-type impurity ions such as phosphorous ions are implanted into the silicon substrate 101 with am ask of the reduced gate electrode layer 204 and the thick silicon oxide layer 202, to form lean, i.e., low concentration N⁻-type impurity regions 206a and 206b.

Thus, also in the second prior art manufacturing method as illustrated in FIGS. 2A to 2D, the N⁻-type impurity regions 206a and 206b and the N⁺-type impurity regions 205a and 205b are in self-alignment with the gate electrode layer 204. However, a channel region beneath the gate electrode layer 204 into which P-type impurity ions such as boron ions are implanted to adjust the threshold voltage is not in self-alignment with the gate electrode layer 204, since such ion implantation is carried out before the formation of the gate electrode layer 204. Therefore, the transistor characteristics such as the threshold voltage and the breakdown voltage fluctuate in accordance with the fluctuation of location of the channel region. Since an isotropical etching process is used, a reduced gate electrode, which is smaller than minimum size determined by an exposure system can be obtained. For example, a gate length of sub μ smaller than 0.5 μm can be obtained. However, the size of such a reduced gate electrode is variable.

FIGS. 3A to 3D are cross-sectional views for explaining a third prior art method for manufacturing an LDD type MOS transistor (see FIG. 1 of JP-A-4-346476).

Figure 3A:
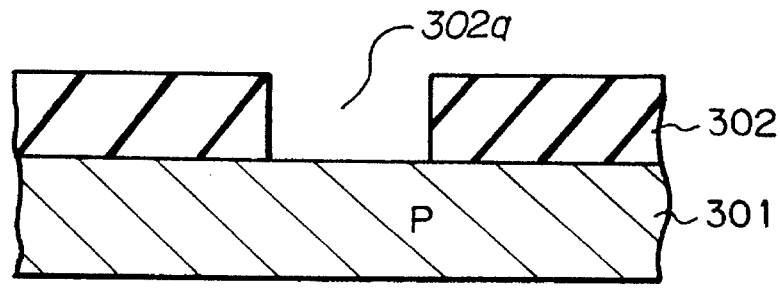
FIGS. 3A through 3D are cross-sectional views illustrating a third prior art method for manufacturing an LDD type MOS device.

First, referring to FIG. 3A, a silicon oxide layer 302 is formed by a CVD process on a P-type monocrystalline silicon substrate 301, and an opening 302a is perforated in the silicon oxide layer 302.

Figure 3B:
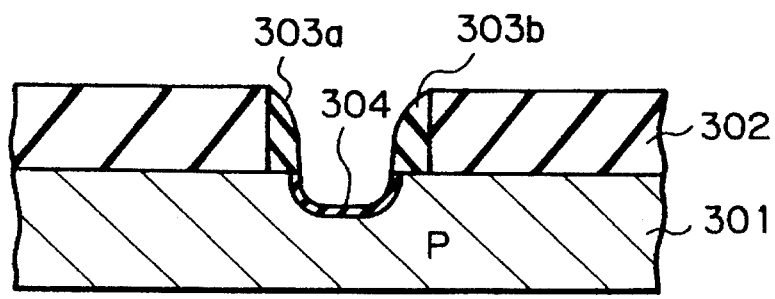

Next, referring to FIG. 3B, a silicon nitride layer is formed on the entire surface by a CVD process, and the silicon nitride layer is etched back by an anisotropical RIE process to form sidewall silicon nitride layers 303a and 303b. In this case, the silicon substrate 301 is also etched. Then, the silicon substrate 301 is thermally oxidized to form a gate silicon oxide layer 304 therein.

Figure 3C:
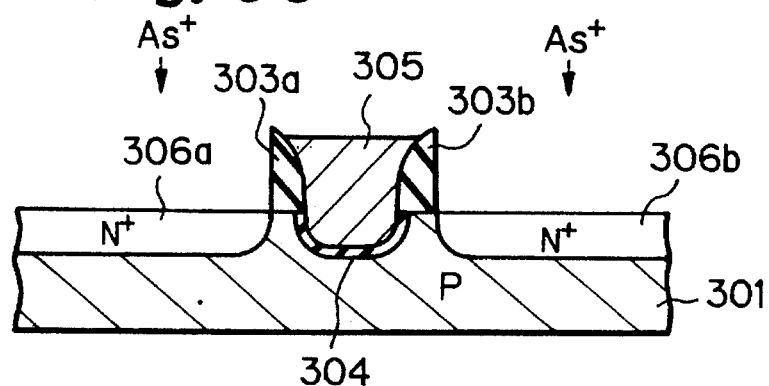

Next, referring to FIG. 3C, a polycrystalline silicon layer is formed by a CVD process on the entire surface, and is etched back so that a gate electrode layer 305 is left on the gate silicon oxide layer 304. In this case, the silicon oxide layer 302 is etched, and also the silicon substrate 301 is etched. Next, N-type impurity ions such as arsenic ions are implanted into the silicon substrate 301 with a mask of the gate electrode layer 305 and the sidewall silicon nitride layers 303a and 303b to form rich, i.e., high concentration $N^+$-type impurity regions 306a and 306b.

Figure 3D:
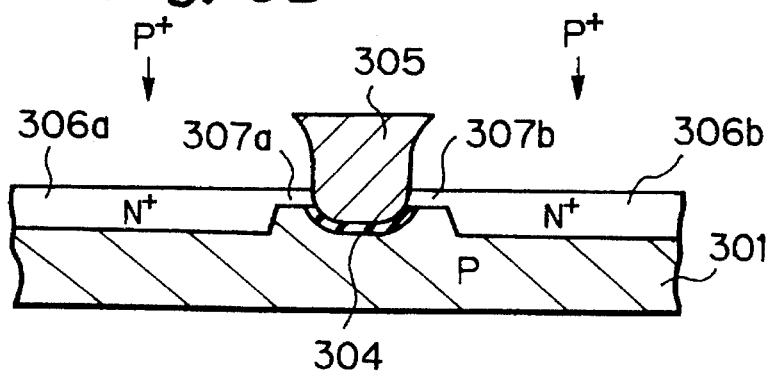

Finally, referring to FIG. 3D, the sidewall silicon nitride layers 303a and 303b are removed. Then, N-type impurity ions such as phosphorous ions are implanted into the silicon substrate 301 with a mask of the gate electrode layer 305 to form lean, i.e., low concentration N-type impurity regions 307a and 307b.

Thus, also in the third prior art manufacturing method as illustrated in FIGS. 3A to 3D, the $N^-$-type impurity regions 307a and 307b and the $N^+$-type impurity regions 205a and 205b are in self-alignment with the gate electrode layer 305. Also, in this case, a channel region beneath the gate electrode layer 305 into which P-type impurity ions such as boron ions are implanted to adjust the threshold voltage is in self-alignment with the gate electrode layer 305. Further, a reduced gate electrode, which is smaller than a minimum size determined by an exposure system can be obtained. For example, a gate length of sub μ smaller than 0.5 μm can be obtained. However, since the gate electrode layer 305 is partly buried in the silicon substrate 301, the silicon substrate 301 is so damaged that defects are easily created in the channel region. As a result, the performance and reliability of the MOS device is deteriorated.

Figure 4A:
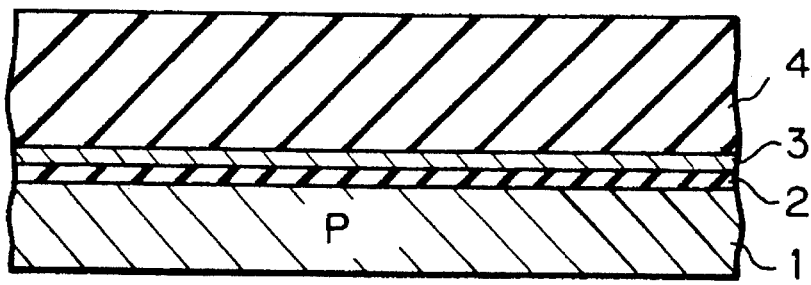
FIGS. 4A through 4O are cross-sectional views for explaining a first embodiment of the method for manufacturing an LDD type MOS device according to the present invention.
Figure 4B:
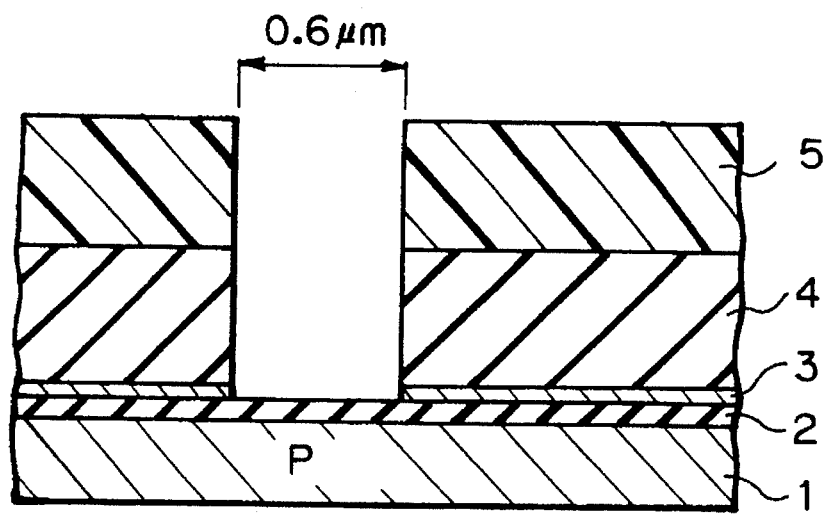
Figure 4C:
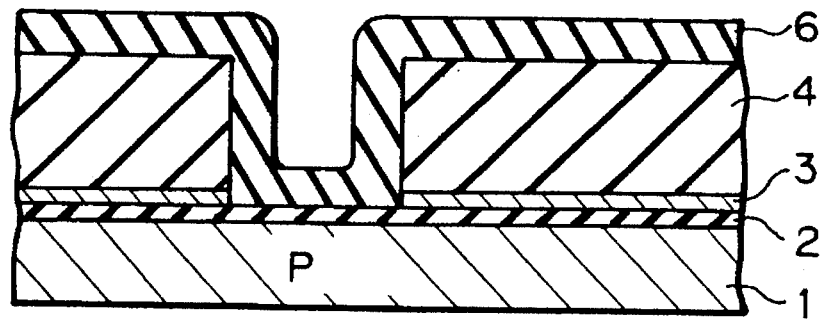
Figure 4D:
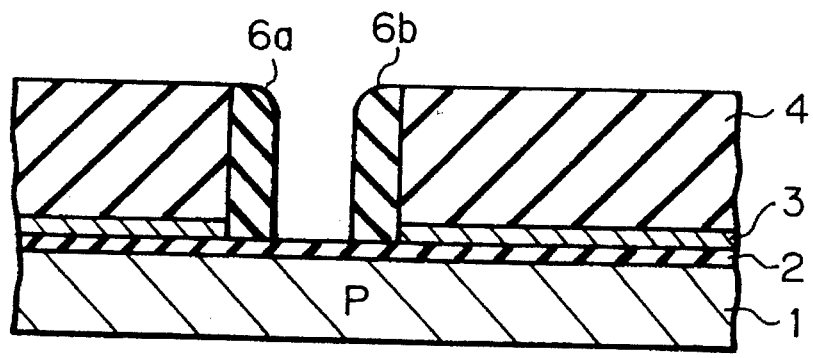
Figure 4E:
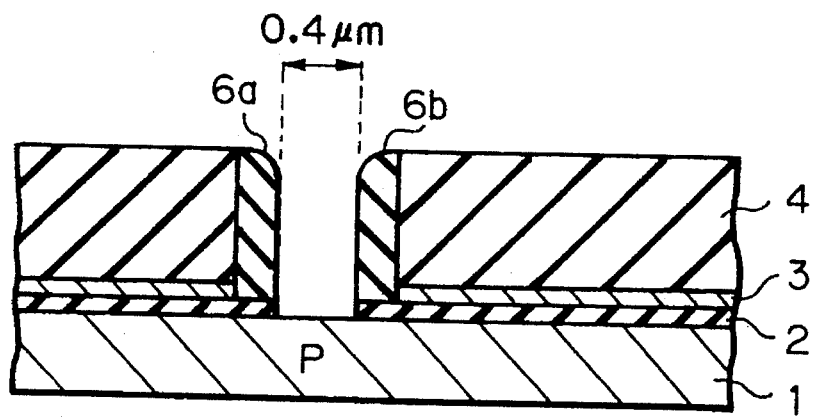
Figure 4F:
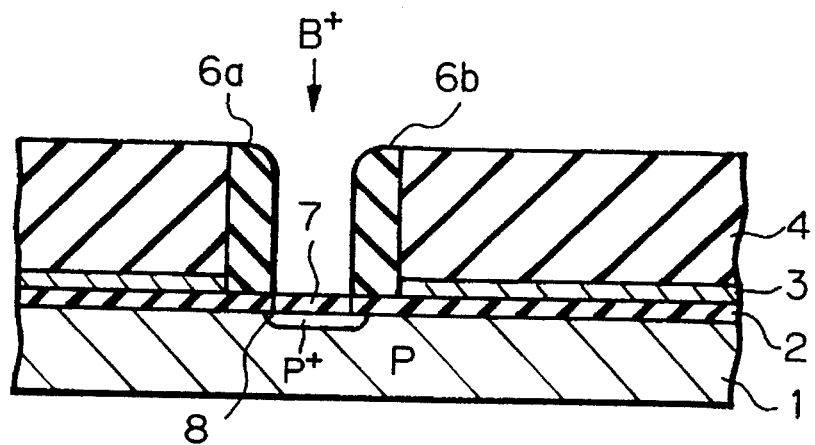
Figure 4G:
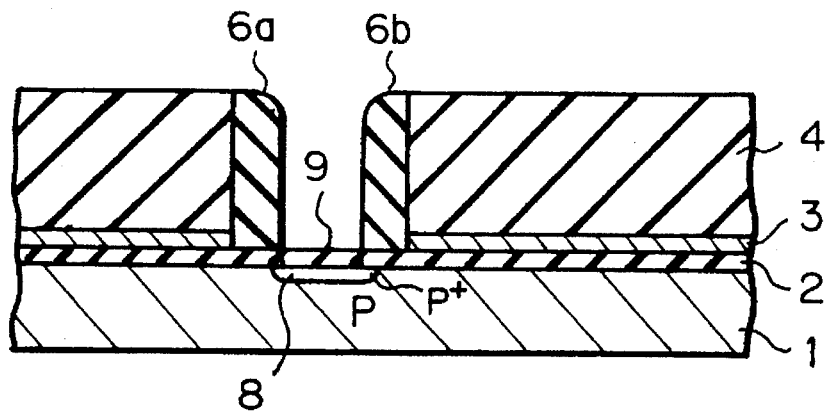
Figure 4H:
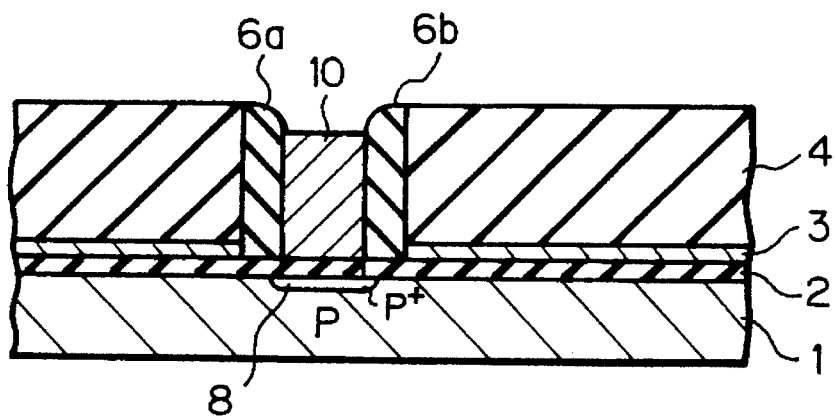
Figure 4I:
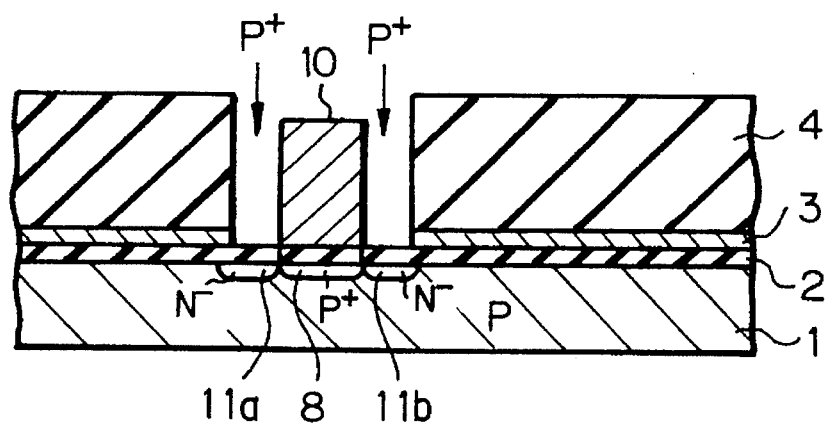
Figure 4J:
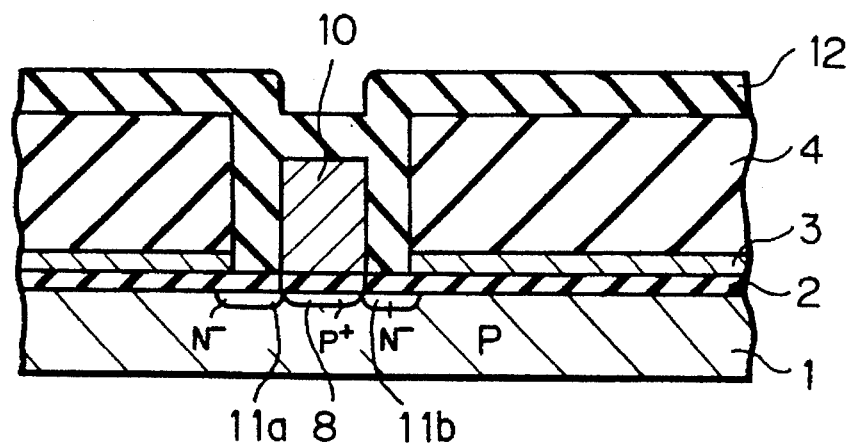
Figure 4K:
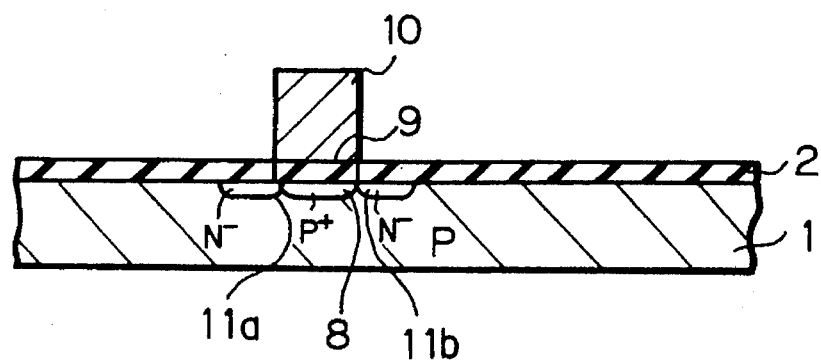
Figure 4L:
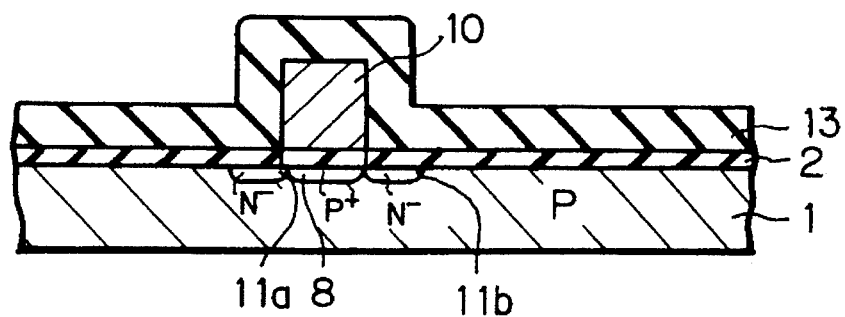
Figure 4M:
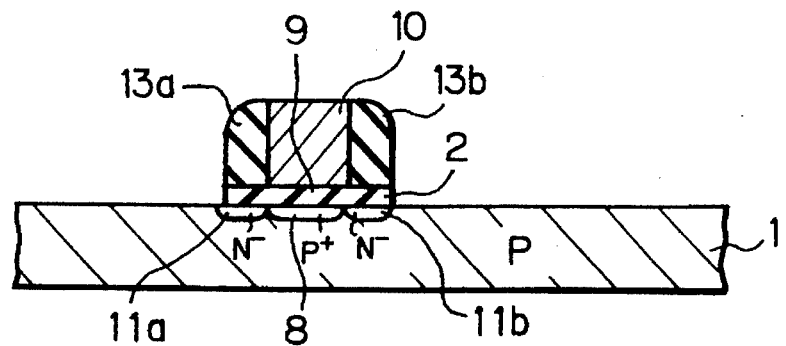
Figure 4N:
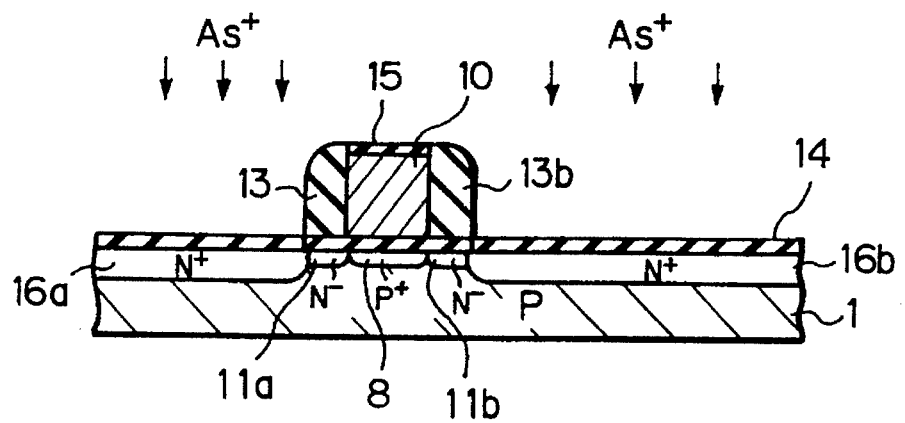
Figure 4O:
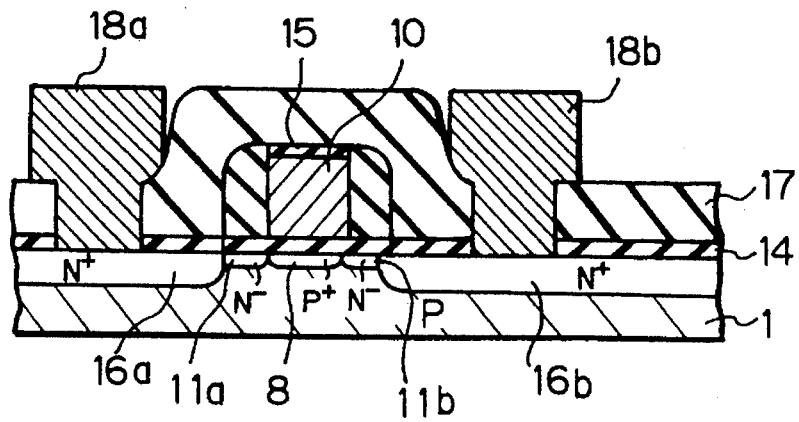

FIGS. 4A through 4O are cross-sectional views for explaining a first embodiment of the method for manufacturing an LDD type MOS transistor according to the present invention.

First, referring to FIG. 4A, an about 100 Å thick silicon oxide layer 2 is formed by thermally oxidizing a P-type monocrystalline silicon substrate 1. Then, an about 200 Å thick polycrystalline silicon layer 3 is formed thereon by a low pressure CVD (LPCVD) process. Further, an about 5000 Å thick silicon oxide layer 4 is formed thereon by a CVD process.

Next, referring to FIG. 4B, a photoresist layer 5 having an about 0.6 μm pattern is formed. In this case, assume that the gate length is 0.4 μm, and therefore, the pattern size 0.6 μm is larger than the gate length by 0.2 μm. Then, the silicon oxide layer 4 is etched by an RIE process using $CHF_3$ gas with a mask of the photoresist layer 5. In this case, since the etching rate of the polycrystalline silicon layer 3 is smaller than that of the silicon oxide layer 4 with respect to $CHF_3$ gas, the polycrystalline silicon layer 3 serves as an etching stopper. Note that the increase of 0.2 μm in size is twice the thickness of sidewall silicon nitride layers 6a and 6b, which will be explained later.

Then, the polycrystalline silicon layer 3 is etched by a plasma etching process using $SF_6$ gas. In this case, the silicon oxide layers 4 and 2 are hardly etched by $SF_6$ gas, and, therefore, the silicon oxide layers 4 and 2 serve as etching stoppers. Then, the photoresist layer 5 is removed.

Next, referring to FIG. 4C, an about 1000 Å thick silicon nitride layer 6 is formed on the entire surface by a CVD process.

Next, referring to FIG. 4D, the silicon nitride layer 6 is etched back by an RIE process using $CHF_3$ gas to form sidewall silicon nitride layers 6a and 6b.

Next, referring to FIG. 4E, the silicon oxide layer 2 is etched by using buffered HF fluid. Thus, a channel region of the silicon substrate 1 having a length of 0.4 μm is exposed without damaging the silicon substrate 1.

Next, referring to FIG. 4F, an about 300 Å thick silicon oxide layer 7 is formed on the channel region of the silicon substrate 1 by thermally oxidizing it. Then, about $10^{12}$ to $10^{13}$ boron ions/$cm^2$ are implanted at an energy of about 15 keV into the channel region of the silicon substrate 1, to form a $P^+$-type impurity region 8. The $P^+$-type impurity region 8 adjusts the threshold voltage of the MOS transistor. Then, the silicon oxide layer 7 is removed by buffered HF fluid.

Next, referring to FIG. 4G, the channel region of the silicon substrate 1 is thermally oxidized to form an about 100 Å gate silicon oxide layer 9.

Next, referring to FIG. 4H, an about 2000 to 4000 Å thick polycrystalline silicon layer is formed by an LPCVD process, and is etched back by a plasma etching process using $SF_6$ gas. As a result, a gate electrode layer 10 made of polycrystalline silicon is buried in an opening surrounded by the sidewall silicon nitride layers 6a and 6b.

Next, referring to FIG. 4I, the sidewall silicon nitride layers 6a and 6b are removed by hot phosphoric acid. Then, about $10^{13}$ to $10^{14}$ phosphorous ions/$cm^2$ are implanted at an energy of about 30 keV into the silicon substrate 1, to form lean, i.e., low concentration $N^-$-type impurity regions 11a and 11b. Also, in this case, about $10^{12}$ to $10^{13}$ boron ions/$cm^2$ can be implanted at an energy of 30 to 50 keV to suppress the diffusion of impurities of $N^+$-type impurity regions 16a and 16b, which will be explained later.

Next, referring to FIG. 4J, a high temperature silicon oxide (HTO) layer 12, which has good step coverage characteristics, is formed by a high temperature CVD process. Then, the HTO layer 12 and the silicon oxide layer 4 are etched by a plasma etching process using $CHF_3$ gas, and thereafter, the polycrystalline silicon layer 3 is etched by using an RIE process using $SF_6$ gas. As a result, a configuration as illustrated in FIG. 4K is obtained. In this case, a thickness of about 200 to 300 Å of the gate electrode layer 10 is also etched.

Next, referring to FIG. 4L, an HTO layer 13 is formed on the entire surface by a high temperature CVD process. Then, the HTO layer 13 is etched back by a plasma etching process using $CHF_3$ gas, so that sidewall silicon oxide layers 13a and 13b are left on the sidewalls of the gate electrode layer 10 as illustrated in FIG. 4M. In this case, the silicon oxide layer 2 in the source/drain regions is also etched.

Next, referring to FIG. 4N, the silicon substrate 1 is thermally oxidized to form a silicon oxide layer 14. Then, about $10^{15}$ to $10^{16}$ arsenic ions/$cm^2$ are implanted at an energy of about 50 keV into the source/drain regions of the silicon substrate 1, to form rich, i.e., high concentration $N^+$-type impurity regions 16a and 16b.

Finally, referring to FIG. 4O, a silicon oxide layer 17 is formed by a CVD process, and openings are formed therein. Then, metal electrode layers 18a and 18b are formed in the openings.

Thus, in the first embodiment as illustrated in FIGS. 4A through 4O, the channel region, the $N^-$-type impurity regions 11a and 11b, and the $N^+$-type impurity regions 16a and 16b are all in self-alignment with the gate electrode layer 9. Also, the silicon substrate 1 is not damaged.

FIGS. 5A through 5D are cross-sectional views for explaining a second embodiment of the method for manufacturing an LDD type MOS transistor according to the present invention.

Figure 5A:
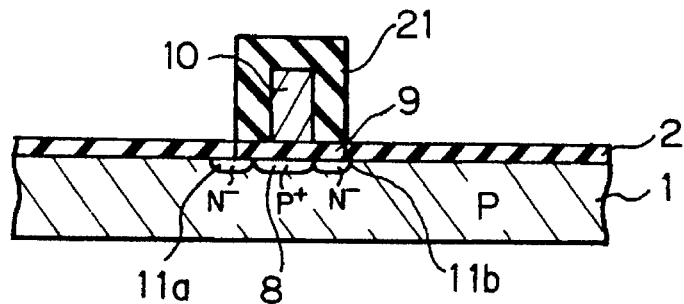
FIGS. 5A through 5D are cross-sectional views for explaining a second embodiment of the method for manufacturing an LDD type MOS device according to the present invention.
Figure 5B:
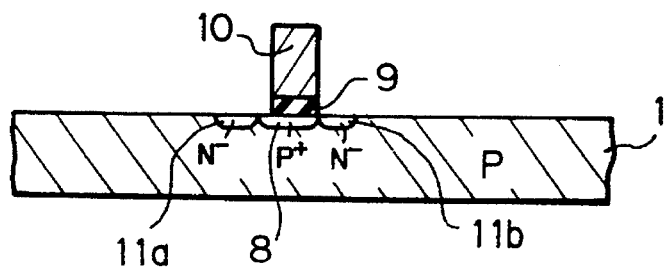
Figure 5C:
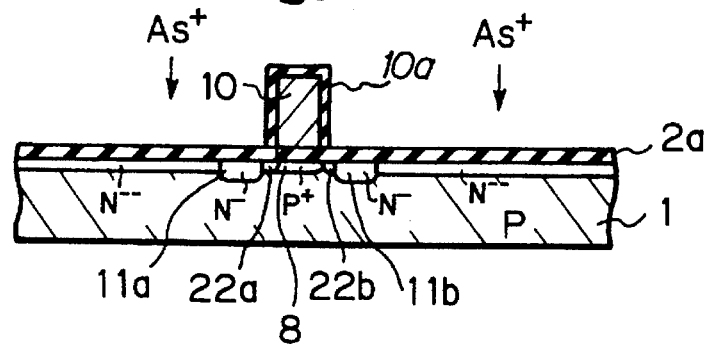

In the second embodiment, after the processes as illustrated in FIGS. 4A through 4K are carried out, processes as illustrated in FIGS. 5A, 5B and 5C are carried out.

First, referring to FIG. 5A, the gate electrode layer 10 is thermally oxidized to form an about 1000 Å thick silicon oxide layer 21. In this case, the thickness of the gate electrode layer 10 is reduced by about 550 Å. Then, the silicon oxide layer 21 and the silicon oxide layer 2 are removed by an isotropical etching process as illustrated in FIG. 5B.

Next, referring to FIG. 5C, a thermal oxidation is carried out to form a silicon oxide layer 2a on the silicon substrate 1 and a silicon oxide layer 10a on the gate electrode layer 10. Then, about $10^{12}$ to $10^{13}$ arsenic ions/cm$^2$ are implanted at an energy of about 20 to 30 keV into the silicon substrate 1. As a result, leaner, i.e., lower concentration $N^{--}$-type impurity regions 22a and 22b are formed between the $P^+$-type impurity region (channel region) 8 and the $N^-$-type impurity regions 11a and 11b. Thus, the gate electrode layer 10 is further reduced.

Next, the processes as illustrated in FIGS. 4L through 4O are carried out. As a result, a configuration as illustrated in FIG. 5D is obtained.

Figure 5D:
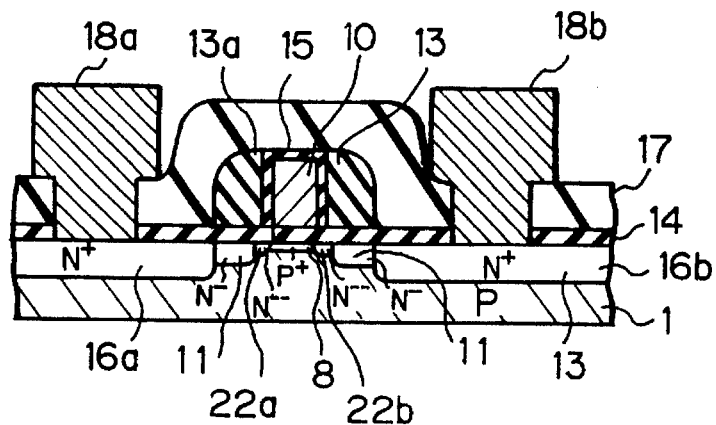

The configuration as illustrated in FIG. 5D is the same as that as illustrated in FIG. 4O, except for the $N^{--}$-type impurity regions 22a and 22b.

In the second embodiment as illustrated in FIGS. 5A through 5D in addition to FIGS. 4A through 4O, an electric field in the proximity of the drain region is further relaxed due to the presence of the $N^{--}$-type impurity regions 22a and 22b as compared with the first embodiment. Also, a finer structure of the gate electrode can be obtained as compared with the first embodiment.

Although the above-described embodiments illustrate an N-channel type MOS device, it goes without saying that the present invention can also be applied to a P-channel type MOS device.

As explained hereinbefore, according to the present invention, since the channel region, the low concentration impurity regions (LDD regions) and the high concentration impurity regions (source/drain regions) are all in self-alignment with the gate electrode, the characteristics of the MOS device can be improved. Also, the gate electrode can be further fined. Further, since the substrate is hardly damaged, the defects of the channel region can be suppressed, to thereby improve the performance and reliability of the MOS device. Still further, the relaxation of an electric field due to the LDD structure can be further developed.

I claim:

1. A method for manufacturing a lightly-doped drain (LDD)-type semiconductor device, comprising the steps of:

forming an insulating layer on a semiconductor substrate of a first conductivity type;

forming an opening in said insulating layer;

forming a first sidewall insulating layer on a sidewall of said insulating layer within said opening;

forming a gate insulating layer on said semiconductor substrate within said opening;

forming a gate electrode buried in said opening on said first sidewall insulating layer and said gate insulating layer;

removing said first sidewall insulating layer after formation of said gate electrode;

introducing impurities of a second conductivity type opposite to said first conductivity type into said semiconductor substrate with a mask of said gate electrode and said insulating layer to form a first impurity region of said second conductivity type in said semiconductor substrate;

removing said insulating layer after formation of said first impurity region;

forming a second sidewall insulating layer on a sidewall of said gate electrode after removal of said insulating layer; and introducing impurities of said second conductivity type into said semiconductor substrate with a mask of said gate electrode and said second sidewall insulating layer to form a second impurity region of said second conductivity type in said semiconductor substrate, said second impurity region having a higher impurity concentration than said first impurity region.

2. A method as set forth in claim 1, further comprising a step of introducing impurities of said first conductivity type into said semiconductor substrate with a mask of said first sidewall insulating layer and said insulating layer before formation of said gate insulating layer.

3. A method as set forth in claim 1, further comprising the steps of:

reducing said gate electrode in size after removal of said insulating layer before formation of said second sidewall insulating layer;

introducing impurities of said second conductivity type into said semiconductor substrate with a mask of said reduced gate electrode to form a third impurity region of said second conductivity type, said third impurity region having a lower impurity concentration than said first impurity region.

4. A method as set forth in claim 3, wherein said gate electrode is made of polycrystalline silicon, said gate electrode reducing step comprises the steps of:

thermally oxidizing said gate electrode to form a silicon oxide layer thereon; and removing said silicon oxide layer.

5. A method for manufacturing a lightly-doped drain (LDD)-type semiconductor device, comprising the steps of:

forming an insulating layer on a semiconductor substrate of a first conductivity type;

forming an opening in said insulating layer;

forming a first sidewall insulating layer on a sidewall of said insulating layer within said opening;

introducing impurities of said first conductivity type into said semiconductor substrate with a mask of said first sidewall insulating layer and said insulating layer to form a first impurity region of said first conductivity type in said semiconductor substrate;

forming a gate insulating layer on said semiconductor substrate within said opening;

forming a gate electrode buried in said opening on said first sidewall insulating layer and said gate insulating layer;

removing said first sidewall insulating layer after formation of said gate electrode;

introducing impurities of a second conductivity type opposite to said first conductivity type into said semiconductor substrate with a mask of said gate electrode and said insulating layer to form a second impurity region of said second conductivity type in said semiconductor substrate;

removing said insulating layer after formation of said second impurity region;

reducing said gate electrode in size after removal of said insulating layer;

introducing impurities of said second conductivity type into said semiconductor substrate with a mask of said reduced gate electrode to form a third impurity region of said second conductivity type, said third impurity region having a lower impurity concentration than said second impurity region;

forming a second sidewall insulating layer on a sidewall of said gate electrode after formation of said third impurity region; and introducing impurities of said second conductivity type into said semiconductor substrate with a mask of said gate electrode and said second sidewall insulating layer to form a fourth impurity region of said second conductivity type in said semiconductor substrate, said fourth impurity region having a higher impurity concentration than said second impurity region.

6. A method for manufacturing a lightly-doped drain (LDD)-type semiconductor device, comprising the steps of:

forming a first silicon oxide layer on a semiconductor substrate of a first conductivity type;

forming a polycrystalline silicon layer on said first silicon oxide layer;

forming a second silicon oxide layer on said polycrystalline silicon layer;

etching said second silicon oxide layer by using said polycrystalline silicon layer as an etching stopper to form an opening in said second silicon oxide layer;

etching said polycrystalline silicon layer by using said first silicon oxide layer as an etching stopper with a mask of said second silicon oxide layer;

forming a silicon nitride layer on said first and second silicon oxide layers after etching said polycrystalline silicon layer;

etching back said silicon nitride layer to form a first sidewall layer on a sidewall of said second silicon oxide layer and said polycrystalline silicon layer;

removing said first silicon oxide layer in said opening and forming a third silicon oxide layer on said semiconductor substrate;

introducing impurities of said second conductivity type via said third silicon oxide layer into said semiconductor substrate;

removing said third silicon oxide layer and forming a gate oxide layer on said semiconductor substrate;

forming a gate electrode on said gate silicon oxide layer and surrounded by said first sidewall layer;

removing said first sidewall layer surrounding said gate electrode;

introducing impurities of a second conductivity type opposite to said first conductivity type into said semiconductor substrate with a mask of said gate electrode and said second silicon oxide layer to form a second impurity region of said conductivity type;

removing said second silicon oxide layer and said polycrystalline silicon layer after formation of said second impurity region;

forming a second sidewall layer on a sidewall of said gate electrode after removal of said second silicon oxide layer and said polycrystalline silicon layer; and introducing impurities of said second conductivity type into said semiconductor substrate with a mask of said gate electrode and said second sidewall layer to form a third impurity region of said second conductivity type, said third impurity region having a higher impurity concentration than said second impurity region.

7. A method a set forth in claim 6, wherein said first silicon oxide layer removing step comprises removing said first silicon oxide layer by a wet etching process.

8. A method as set forth in claim 6, wherein said second silicon oxide layer and polycrystalline silicon layer removing step comprises the steps of:

forming a first high temperature silicon oxide (HTO) layer on the entire surface; and etching back said first HTO layer, said second silicon oxide layer and said polycrystalline silicon layer.

9. A method as set forth in claim 6, wherein said second sidewall layer forming step comprises the steps of:

forming a second high temperature silicon oxide (HTO) layer on the entire surface; and etching back said second HTO layer.

10. A method for manufacturing a lightly-doped drain (LDD)-type semiconductor device, comprising the steps of:

forming a first silicon oxide layer on a semiconductor substrate of a first conductivity type;

forming a polycrystalline silicon layer on said first silicon oxide layer;

forming a second silicon oxide layer on said polycrystalline silicon layer;

etching said second silicon oxide layer by using said polycrystalline silicon layer as an etching stopper to form an opening in said second silicon oxide layer;

etching said polycrystalline silicon layer by using said first silicon oxide layer as an etching stopper with a mask of said second silicon oxide layer;

forming a silicon nitride layer on said first and second silicon oxide layers after etching said polycrystalline silicon layer;

etching back said silicon nitride layer to form a first sidewall layer on a sidewall of said second silicon oxide layer and said polycrystalline silicon layer;

removing said first silicon oxide layer in said opening and forming a third silicon oxide layer on said semiconductor substrate;

introducing impurities of said second conductivity type via said third silicon oxide layer into said semiconductor substrate;

removing said third silicon oxide layer and forming a gate oxide layer on said semiconductor substrate;

forming a polycrystalline silicon gate electrode on said gate silicon oxide layer and surrounded by said first sidewall layer;

removing said first sidewall layer surrounding said polycrystalline silicon gate electrode;

introducing impurities of a second conductivity type opposite to said first conductivity type into said semiconductor substrate with a mask of said polycrystalline silicon gate electrode and said second silicon oxide layer to form a second impurity region of said conductivity type;

removing said second silicon oxide layer and said polycrystalline silicon layer after formation of said second impurity region;

thermally oxidizing said polycrystalline silicon gate electrode after removal of said second silicon oxide layer and said polycrystalline silicon layer, to form a fourth silicon oxide layer on said polycrystalline silicon gate electrode;

removing said fourth silicon oxide layer;

forming a second sidewall layer on a sidewall of said polycrystalline silicon gate electrode after removal of said fourth silicon oxide layer; and introducing impurities of said second conductivity type into said semiconductor substrate with a mask of said polycrystalline silicon gate electrode and said second sidewall layer to form a third impurity region of said second conductivity type, said third impurity region having a higher impurity concentration than said second impurity region.

11. A method as set forth in claim 10, wherein said first silicon oxide layer removing step comprises removing said first silicon oxide layer by a wet etching process.

12. A method as set forth in claim 10, wherein said second silicon oxide layer and polycrystalline silicon layer removing step comprises the steps of:

forming a first high temperature silicon oxide (HTO) layer on the entire surface; and etching back said first HTO layer, said second silicon oxide layer and said polycrystalline silicon layer.

13. A method as set forth in claim 10, wherein said second sidewall layer forming step comprises the steps of:

forming a second high temperature silicon oxide (HTO) layer on the entire surface; and etching back said second HTO layer.

* * * * *